CONTROLLED RECTIFIER SEMICONDUCTOR DEVICE

Filed March 29, 1967

INVENTORS
Clifford V. Miles
and John M. Garrett
BY
C. L. Menzemer
ATTORNEY

United States Patent Office 3,476,989
Patented Nov. 4, 1969

3,476,989

CONTROLLED RECTIFIER SEMICONDUCTOR DEVICE

Clifford V. Miles and John M. Garrett, London, England, assignors to Westinghouse Brake and Signal Company Limited, London, England, a corporation of Great Britain Filed Mar. 29, 1967, Ser. No. 626,869
Claims priority, application Great Britain, Apr. 15, 1966, 16,573/66
Int. Cl. H01l *11/00;* H03k *19/08*
U.S. Cl. 317—235 1 Claim

ABSTRACT OF THE DISCLOSURE

The speed with which a controlled rectifier or thyristor changes from the "off" to the "on" state is dependent on the magnitude of the gating pulse.

In this invention a feedback loop is added within the device which effectively amplifies the gate driving pulse seen by the main current carrying electrode. Hence, using quite small triggering pulses, the device may be switched in circuits supplying high values of $(dI/dT)$.

This application is based on British patent application 16,573/66, filed Apr. 15, 1966, and assigned to the assignee of the present application.

BACKGROUND OF THE INVENTION

This application relates to semiconductor devices and more particularly to thyristors.

The rate of increase in current $(dI/dT)$ is a common cause of failure in thyristors. This invention provides a device that does not require special suppression of $(dI/dT)$ values as in prior art devices.

SUMMARY

In the present invention there is provided a controlled rectifier or thyristor having four layers of alternate p-type and n-type semiconductor material one layer being formed with two distinct sections, one section being in contact with one of the main current carrying electrodes of the device and the other section being an auxiliary section capable of providing a current path therefrom via part of the adjacent layer of opposite type to the other section for the initiation of the forward breakover condition of the device by first establishing a breakover between the auxiliary section and the main current carrying electrodes.

DESCRIPTION OF THE PREFERRED EMBODIMENT

In order that the invention may be clearly understood and readily carried into effect, the same will be further described by way of example with reference to FIGURES 1 to 5, of the accompanying drawings, which illustrate various embodiments of the invention.

Figure 1:
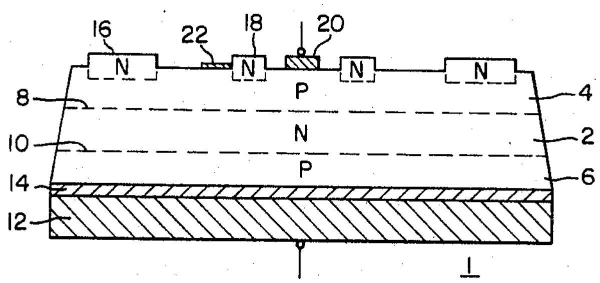
FIGS. 1 through 5 are side views in section of thyristors made in accordance with the teachings of this invention.

Referring to FIG. 1 there is shown a thyristor 1 utilizing the teachings of this invention.

The device 1 is comprised of an n-type region 2 and p-type regions 4 and 6. There is a p-n junction 8 between regions 2 and 4 and a p-n junction 10 between regions 2 and 6.

A metal anode contact 12 is solder by a solder layer 14 to region 6.

There is also an n-type cathode section 16 of gold antimony and a second auxiliary n-type cathode section 18 of gold antimony formed by diffusion in region 4. In addition, a conventional type of gate dot 20 of gold boron is provided in ohmic contact apart from the two cathodes, on the surface of p-type region 4. Further, between the auxiliary cathode 18 and the main cathode section 16, there is provided a small ohmic shorting contact on the edge of the auxiliary cathode 18 on to the surface of p-type region 4 by provision of a small electroless plated fillet 22 of conducting material.

In operation of the device, the cathode section 16 constitutes as aforementioned the main cathode of the device, the element 20 constitutes the gating electrode and the element 18 constitutes what may be referred to as the auxiliary cathode. On triggering the device, a gate current passed between the gate 20 and the main cathode 16, will pass through the auxiliary cathode 18 as a preferred low resistance path, and return to the p-region 4 via the shorting fillet 22. It then returns to the gate driver unit, driving the device, via a main cathode 16. This constitutes a gate current for both cathodes 16 and 18. The device is so constructed however, that it will cease to support volts between the anode and the auxiliary cathode at rather lower gate drives than it ceases to support volts between the anode and the main cathode 16. This is believed to be, firstly because the current density is greater at 18, which has a smaller diameter and secondly, the material from which 18 is alloyed may be adjusted to make it preferentially sensitive. The full circuit anode voltage may therefore appear across the gap between 16 and 18 and consequent current which flows along the path between the anode region 6, the auxiliary cathode 18 and the main cathode 16 is equivalent to a very large gate drive into the cathode 16. The effect which is produced therefore is one of switching of the cathode region 16 in an extremely short time, compared to that which may be achieved for example on a conventional controllable rectifier device made with similar basic materials, operated at much larger current levels, for example 2 to 10 amps of gate drive. The gate current required to initiate the cycle of operations with the present device however is substantially smaller, say, of the order of 100 milliamps.

As an alternative to the manner of operation described above, it may be arranged that instead of providing a gate drive between the gate dot 20 and the main cathode 16, a fourth connection may be made to the auxiliary cathode 18 and a floating gate drive, for example via a transformer winding, may be applied between the gate dot 20 and the auxiliary cathode 18. In this case the basic operation of the device is the same but it is expected that substantially less feedback will occur from the device to the gate generator.

Figure 2:
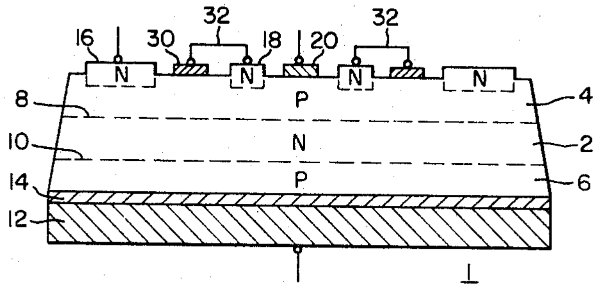

Referring now to FIGURE 2, the device shown in this figure is similar to that of FIGURE 1 in that it is formed in substantially the same manner by diffusing p-type doping material into a basic n-type silicon slice on both sides thereof and subsequently providing a main cathode section, a distinct auxiliary cathode section and a gate dot. However, with this device the shorting means 22 of FIG. 1 is replaced by a further alloyed ohmic contact 30 with a shorting connection 32 therefrom to the auxiliary cathode. This device may be somewhat simpler to manufacture than the device outlined with reference to FIGURE 1 and it also may present a somewhat lower gating impedance to the driver circuit which provides gating signals for operating the device. As in the case of the device of FIGURE 1, gate current is applied thereto between the gate dot 20 and the main cathode 16.

Referring to the device shown in FIGURE 3, this is again basically similar to the device shown in FIGURE 2 except that a fourth terminal 34 is provided connected to the auxiliary cathode 18 for return gate current to the gating generator and in this case gate current is passed between the gate dot 20 and the auxiliary cathode 18 in a similar manner to that mentioned above with reference to the alternative manner of operation of the device of FIGURE 1.

Figure 4:
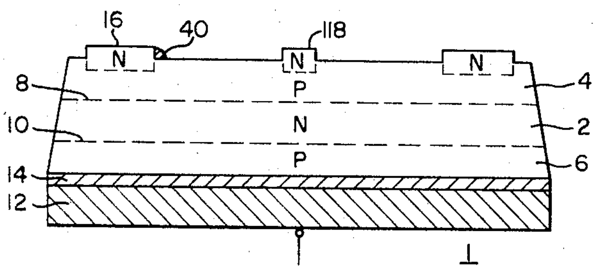

Referring to FIGURE 4, this shows the manner in which the auxiliary cathode 118 may be located in the position conventionally occupied by the ohmic gate dot. In this case no external connection is made direct to the p-type region 4 of the device. Otherwise, the device is constructed similarly to the previously described devices namely based on a body of n-type silicon with p-type layers one on either side thereof. It may however be necessary in certain examples to provide a shorting contact such as 40 between the main cathode 16 and the p-type region 4. This however must only be provided over a very small proportion of the inner periphery of the main cathode 16 if the effectiveness of the device is not to be impaired.

In operation of the device of FIGURE 4, gating current is applied to the device via the main cathode 16 to trigger the auxiliary cathode 18. This then provides a low impedance path between the anode 12 of the device and the auxiliary cathode 18 which in turn provides for gating of the main cathode 16 by virtually the full supply voltage.

Figure 3:
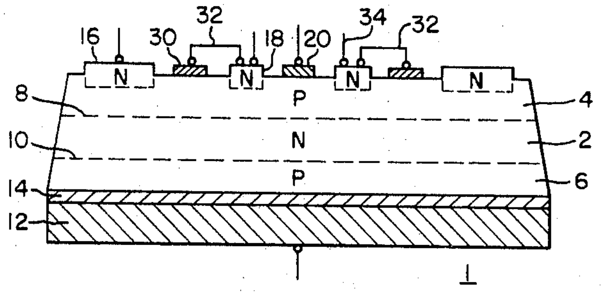
Figure 5:
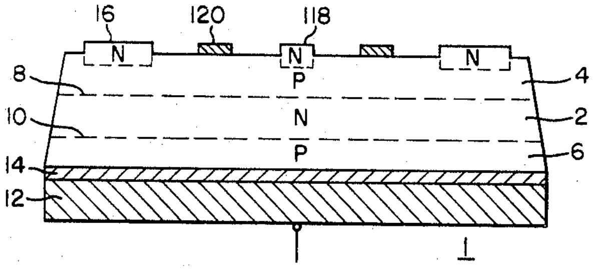

Referring now to the device shown in FIGURE 5, this device, similarly to the device of FIGURE 3, is a 4 terminal device but by transposing the auxiliary cathode 118 and the gate dot 120, the necessity for the additional ohmic contact 30 of FIGS. 2 and 3 is overcome. The device is operated by applying gate current between the gate contact 120 and the auxiliary cathode 118 to trigger the auxiliary cathode which then provides virtually the full supply voltage to trigger the main cathode 16. It may be noted further than if gate current is applied between the gate contact 120 and the main cathode 16, the device operates as a normal well known form of silicon controllable rectifier device.

We claim as our invention:

1. A semiconductor device consisting of a body of semiconductor material, said body having a top surface and a bottom surface, said body being comprised of a first, and second, and a third region of alternate type semiconductivity, the second region being disposed between said first and third regions, said second region being of a first-type of semiconductivity, said first and third regions being of a second-type of semiconductivity, a p-n junction between said first and second regions and a p-n junction between said second and third regions, the first region extending from the second region to the top surface of the body, the third region extending from the second region to the bottom surface of the body, an ohmic electrical contact affixed to the third region along the bottom surface of the body, said ohmic electrical contact being one of the main contacts of the semiconductor device, an annular fourth region formed on the top surface of said body and extending into said first region, said fourth region having said first type of semiconductivity, a p-n junction between said fourth region and said first region, said fourth region being a main cathode region of said device, an ohmic electrical contact affixed to said fourth region, an annular fifth region formed on the top surface of said body, within the enclosure of the fourth region, and extending into said first region, said fifth region having said first type of semiconductivity, a p-n junction between said fifth region and said first region, said fifth region being an auxiliary cathode region of said device, said fifth region being smaller in cross-sectional area than said fourth region, an ohmic electrical contact disposed on the top surface of the body between the fourth and fifth region and contacting the fifth region only along its edge, said contact electrically shorting the fifth region to the first region, and another ohmic electrical contact, serving as a gate contact, disposed on the top surface of the body, within the enclosure of said fifth region, and in contact with said first region.

References Cited

UNITED STATES PATENTS

| | | |
|---|---|---|
| 3,124,703 | 3/1964 | Sylvan. |
| 3,243,669 | 3/1966 | Sah. |
| 3,346,785 | 10/1967 | Beaudouin. |

JOHN W. HUCKERT, Primary Examiner

JERRY D. CRAIG, Assistant Examiner

U.S. Cl. X.R.

307—305